(12) United States Patent
Tai et al.

(10) Patent No.: US 7,033,847 B2
(45) Date of Patent: Apr. 25, 2006

(54) DETERMINING THE MAXIMUM NUMBER OF DIES FITTING ON A SEMICONDUCTOR WAFER

(75) Inventors: Yu-Feng Tai, Hsin-chu (TW); Huan-Yong Chang, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 506 days.

(21) Appl. No.: 10/389,457

(22) Filed: Mar. 14, 2003

(65) Prior Publication Data

US 2004/0180276 A1 Sep. 16, 2004

(51) Int. Cl.
*G01R 31/26* (2006.01)

(52) U.S. Cl. .......................................... 438/15; 438/18
(58) Field of Classification Search .................... 438/5, 438/7, 10–18, 22–24, 29, 31, 34–36, 128–130, 438/149, 484, 538, 464; 700/99, 100–120
See application file for complete search history.

(56) References Cited

U.S. PATENT DOCUMENTS

| | | | | |
|---|---|---|---|---|
| 6,210,984 B1 * | 4/2001 | Farnworth et al. | ............. | 438/15 |
| 6,405,357 B1 * | 6/2002 | Chao et al. | .................... | 716/10 |
| 6,461,938 B1 * | 10/2002 | Nakabayashi | ............... | 438/458 |
| 6,492,187 B1 * | 12/2002 | Farnworth et al. | ............. | 438/15 |
| 6,900,459 B1 * | 5/2005 | Farnworth et al. | ............. | 257/48 |
| 2001/0001078 A1 * | 5/2001 | Nakabayashi | ............... | 438/458 |

\* cited by examiner

*Primary Examiner*—Michael Lebentritt
*Assistant Examiner*—Andre' Stevenson
(74) *Attorney, Agent, or Firm*—Tung & Assoc

(57) ABSTRACT

Determining the maximum number of dies that fit on a semiconductor wafer is disclosed. The x- and y-coordinates of an initial starting position on a semiconductor wafer are determined. The delta-x and delta-y offsets for subsequent starting positions are also determined. Starting at a current position equal to the initial starting position, the following is repeated for each of a predetermined number of times. First, the semiconductor wafer is covered with fields. Second, the number of dies that are completely covered by the semiconductor wafer is counted. Third, the current starting position is increased by the delta-x and the delta-y offsets. Once this has been repeated, the actual starting position is set as the current starting position at which the number of dies completely covered by the semiconductor wafer is maximized.

20 Claims, 4 Drawing Sheets

DETERMINING THE MAXIMUM NUMBER OF DIES FITTING ON A SEMICONDUCTOR WAFER

FIELD OF THE INVENTION

This invention relates generally to semiconductor device fabrication, and more particularly to determining the number of semiconductor devices that can maximally fit on a given semiconductor wafer.

BACKGROUND OF THE INVENTION

The photolithographic process is one of the most important in semiconductor device fabrication. It transfers the designed pattern from a mask or reticle to photoresist that temporarily coats the wafer surface. The difference between a mask and a reticle is that the former usually has a size corresponding to the entire wafer surface, whereas the latter usually has a size corresponding to only a portion of the wafer surface, known as a field. Whereas a wafer's worth of dies is exposed at one time with a mask, only a wafer field's worth of dies is exposed at one time with a reticle. From a starting position on the semiconductor wafer, a field of the wafer is exposed through the reticle. A stepper then moves, or steps, the reticle to the next field, for exposure of this field through the reticle. This process continues until all the fields of the wafer have been exposed.

FIG. 1 illustratively shows an example of this process. The semiconductor wafer 100 is being exposed through a reticle 102 that has four dies 104a, 104b, 104c, and 104d. Of the four dies 104a, 104b, 104c, and 104d, only the die 104a completely lies on the wafer 100. Once the exposure has occurred, the reticle is stepped to another field on the wafer, either to the left or upward, as indicated by the arrows 106 and 108, respectively. In an organized fashion, the reticle is stepped through the entire wafer 100, so that each field of the wafer 100 is completely exposed through the reticle 102. The left and upwards movement indicated by the arrows 106 and 108, respectively, is for example purposes only, and the movement can just as easily be right and/or downward.

Semiconductor wafers themselves come in a number of different sizes, including five, six, eight, and twelve inches. Smaller wafers are typically easier to handle and manufacture, whereas larger wafers allow for higher device yield, which is the number of devices per wafer. The term semiconductor device is synonymous with die, chip, and so on. The dies fabricated on a semiconductor wafer are separated from one another, and packaged individually, to be sold as integrated circuit (IC) devices.

A common goal of semiconductor designers is to maximize the semiconductor die yield. That is, the semiconductor designers attempt to fit a maximum number of semiconductor devices on a given sized wafer. This number varies depending on a number of factors. For instance, the size of the fields, as well as the size of the dies in each field, affects how many dies can fit on a semiconductor wafer. Also important is the orientation of the fields and their dies on the wafer. Generally, a starting place is selected somewhere on the wafer surface, and the semiconductor wafer is completely covered by fields. The number of whole dies is then counted to determine the maximum number of dies that can fit on the wafer.

FIG. 2 shows illustratively an example of this approach. A starting point 202 is selected on the semiconductor wafer 200. Fields are tiled over the wafer 200 until the surface of the wafer 200 is completely covered. Thus, there are fields over the wafer 200 organized into rows 206a, 206b, and 206c, and columns 204a, 204b, 204c, and 204d. Each field corresponds to a two die-by-two die reticle in this example. The number of the dies of these fields that completely fit within the wafer 200 number sixteen, as counted in FIG. 2 itself. The sixteen fields is grossly small as compared to an actual wafer, and is indicated here as an example only. In reality, hundreds of dies typically fit on a given wafer.

While straightforward in theory, determining the maximum number of dies that can fit on a semiconductor wafer has proven to be difficult in practice. An exhaustive search of all the possible configurations of fields and their dies on a semiconductor wafer is time-prohibitive for minute, precise offsets. That is, examining all possible configurations of fields and their dies from all possible starting points, will likely yield the maximum number of dies in principle, but this approach is time-prohibitive in reality.

Other known approaches sacrifice precision to make the determination more tractable. These approaches may only consider the configuration of fields on a semiconductor wafer, and not the dies of the field, also sacrificing accuracy. They may take a "best guess," instead of optimizing the configuration for the given reticle, number of dies in the reticle, and the wafer. They typically do not allow for alignment marks, which are marks placed on the surface of a wafer so that the stepper or other semiconductor fabrication equipment can be properly aligned relative to the wafer. Alignment marks take up space on the wafer that otherwise could be used for dies. Even with all these sacrifices, prior art approaches for determining the maximum number of dies that fit on a wafer are still nevertheless slow.

Therefore, there is a need for an approach for determining the maximum number of semiconductor dies that fit on a semiconductor wafer that overcome these problems. Precision and accuracy should not be sacrificed by the approach. Optimization for a given reticle, number of dies in the reticle, and the wafer should be taken into account by the approach. Alignment marks should also be taken into account by the approach. For these and other reasons, there is a need for the present invention.

SUMMARY OF THE INVENTION

The invention relates to determining the maximum number of dies that fit on a semiconductor wafer. The x- and y-coordinates of an initial starting position on a semiconductor wafer are determined. The delta-x and delta-y offsets for subsequent starting positions are also determined. Starting at a current position equal to the initial starting position, the following is repeated for each of a predetermined number of times. First, the semiconductor wafer is covered with fields. Second, the number of dies that are completely covered by the semiconductor wafer is counted. Third, the current starting position is increased by the delta-x and the delta-y offsets. Once this has been repeated, the actual starting position is set as the current starting position at which the number of dies completely covered by the semiconductor wafer is maximized.

Embodiments of the invention provide for advantages over the prior art. The invention determines the maximum number of semiconductor dies that fit on a semiconductor wafer with a greater degree of precision than the prior art. Embodiments of the invention can allow for the size of a field, corresponding to a reticle, as well as for the size of the dies of the field. That is, field size and die size can be optimized for by the invention. Furthermore, alignment marks can be taken into account by embodiments of the invention when determining the maximum number of dies that fit on a wafer. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
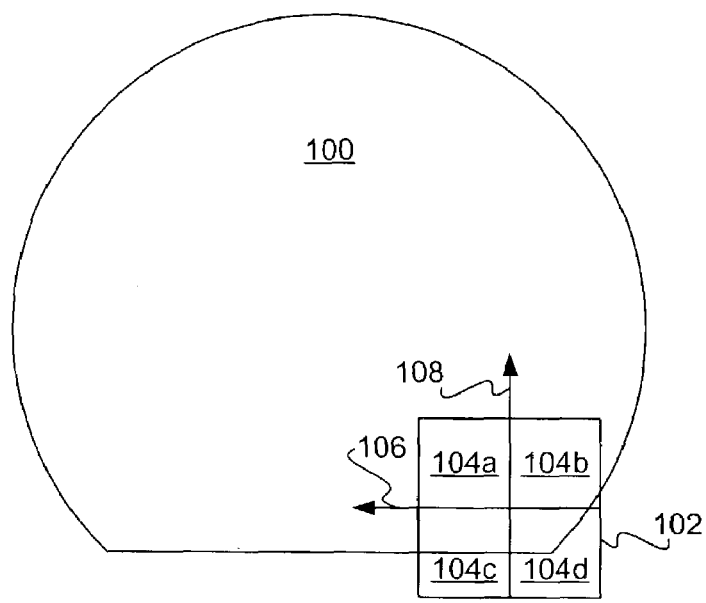
FIG. 1 is a diagram showing how a reticle is stepped through the fields of a semiconductor wafer to expose a photolithographic image on each die of each field of the wafer.
Figure 2:
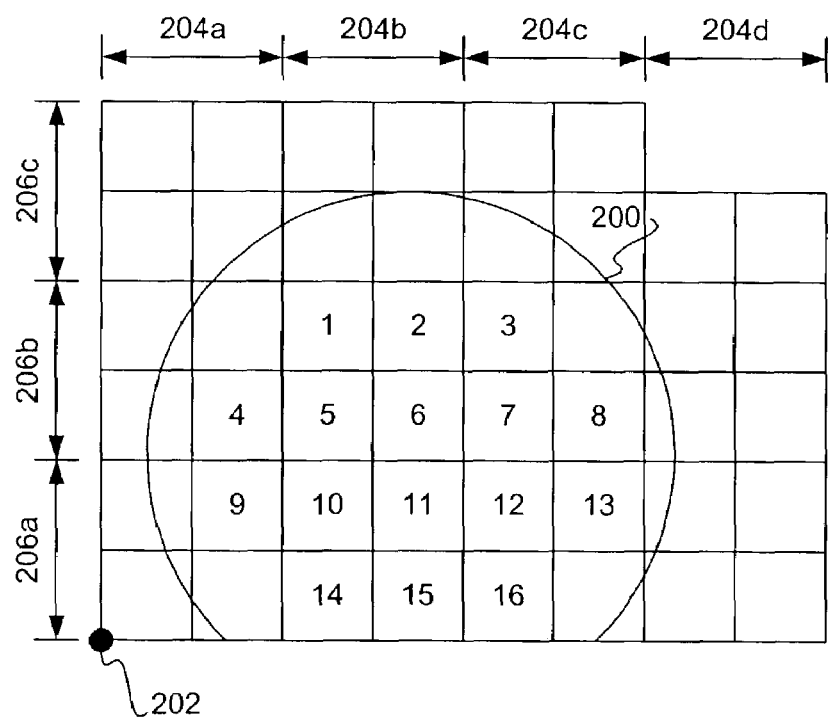
FIG. 2 is another diagram showing how a reticle is stepped through the fields of a semiconductor wafer to expose a photolithographic image on each die of each field of the wafer.
Figure 3:
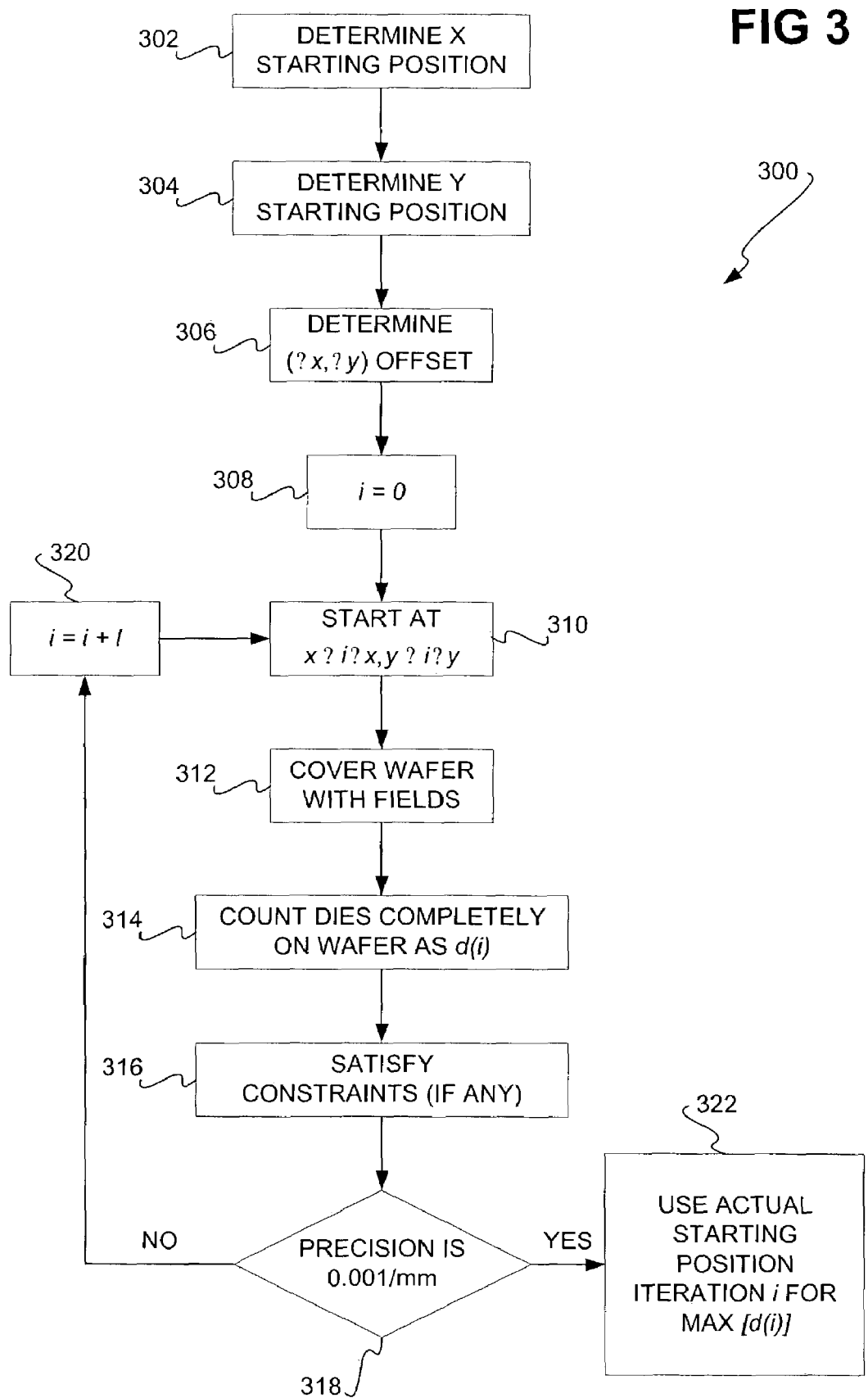
FIG. 3 is a flowchart of a method according to an embodiment of the invention, for determining the number of dies that can fit, preferably maximally, on a semiconductor wafer.

FIG. 3 shows a method 300 for determining the number of dies that can fit on a semiconductor wafer, according to an embodiment of the invention. A semiconductor device can be fabricated at least in part by exposing a photolithographic image on a semiconductor wafer divided into a number of dies through performance of the method 300. First an x-coordinate of an initial starting position is determined (302) and a y-coordinate of the initial starting position is determined (304). The initial starting position is where a field is first positioned, and multiple other fields tiled therefrom, to cover the surface of the wafer. The x-coordinate may be based on the size of the field being used. That is, the x-coordinate may be based on the size of the reticle being used. In one embodiment, the x-coordinate is determined as two times the size of the field divided by three, plus one, where the units are in millimeters. The y-coordinate may be based on the notch reserve distance for the semiconductor wafer, such as equal to this distance.

Figure 4:
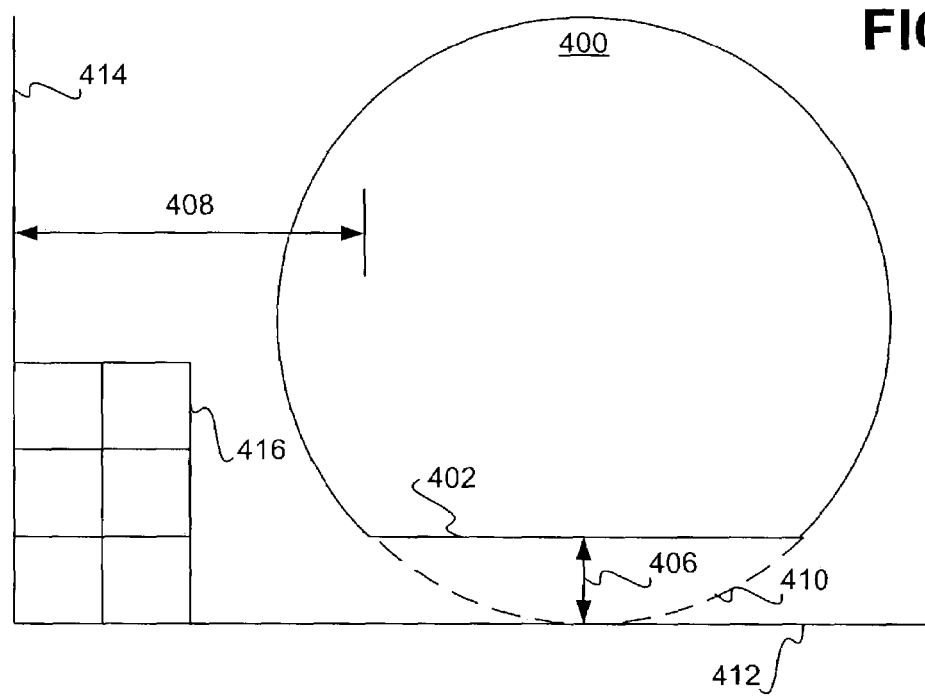
FIG. 4 is a diagram showing illustratively how the starting x position and the starting y position can be determined in the method of FIG. 3, according to an embodiment of the invention.

FIG. 4 shows illustratively the determination of the x-coordinate and the y-coordinate of the initial starting position in one embodiment. The semiconductor wafer 400 departs from being a circular wafer by the notch 402. If the wafer 400 were truly circular, it would extend as indicated by the dotted line 410. The notch 402 is also referred to as a semiconductor flat. The distance between the edge 412 where the wafer 400 would tangentially touch if it were to extend as the dotted line 410 and the notch 402 is indicated as the notch reserve distance 406, and thus is the y-coordinate of the initial starting position. The zero-coordinate on the y-axis is the edge 412, whereas the zero-coordinate on the x-axis is the edge 414, from which the y-coordinate and the x-coordinate, respectively, are measured. For the x-coordinate of the initial starting position, a field 416 having six dies is shown for illustrative purposes. Where the x-coordinate of the initial starting position is three times the horizontal width of the field 416 divided by two, and plus one, the x-coordinate may be the distance indicated as the distance 408.

Referring back to FIG. 3, the offsets delta-x and delta-y are next determined (306). The delta-x and delta-y offsets indicate how much successive starting positions depart from the initial starting position as to the x-coordinate and the y-coordinate, respectively. Thus, for the first starting position after the initial starting position, this position is equal to the x-coordinate plus delta-x and the y-coordinate plus delta-y. Likewise, the second starting position is equal to the x-coordinate plus two times delta-x, and the y-coordinate plus two times delta-y. In one embodiment, the delta-x and delta-y offsets are determined based on the center of the semiconductor wafer and one of the fields covering the wafer after the fields have been tiled thereover, from the initial starting position. More specifically, in one embodiment, the offsets can be determined as the distance between the wafer center and such a field that is nearest the center of the semiconductor wafer.

Figure 5:
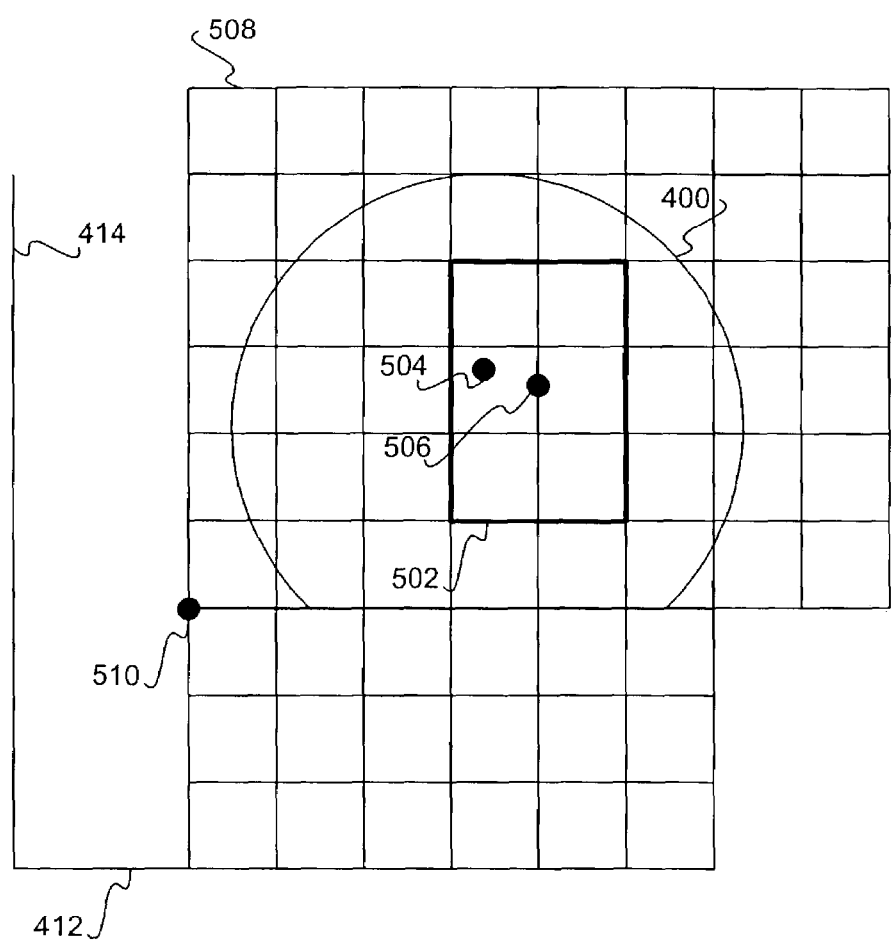
FIG. 5 is a diagram showing illustratively how the field offset can be determined in the method of FIG. 3, according to an embodiment of the invention.
Figure 6:
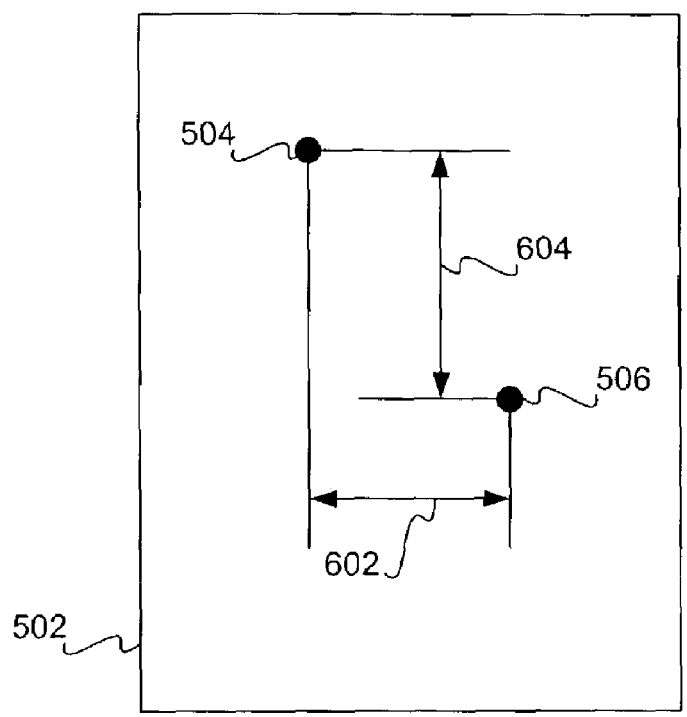
FIG. 6 is a diagram showing illustratively in a more detailed manner how the field offset can be determined in the method of FIG. 3, according to an embodiment of the invention.

FIG. 5 shows illustratively the determination of the offsets delta-x and delta-y in one embodiment. A number of fields 508, such as the field 416 of FIG. 4, have tiled the wafer 400, starting from an initial starting position indicated as the position 510, where the position 510 has the x-coordinate as previously determined measured from the edge 414, and the y-coordinate as previously determined measured from the edge 412. The center of the wafer 400 is indicated as the position 504. The nearest field 502 is the field that actually encompasses or covers the position 504. The nearest field 502 has a center indicated as the position 506. Therefore, the delta-x and the delta-y offsets are determined as the distance between the position 504 and the position 506. FIG. 6 shows the illustrative determination of the offsets delta-x and delta-y of FIG. 5 in more detail. The delta-x offset is the horizontal distance 602 between the position 504 and the position 506. The delta-y offset is the vertical distance 604 between the position 504 and the position 506. Preferably, such offsets have magnitude only, and are not signed.

Referring back to FIG. 3, the method 300, after the x and y starting positions and the delta-x and delta-y offsets are determined, repeats through 308, 310, 312, 314, 316, 318, and 320 for a number of iterations. This process is first summarily described, and then described in detail. In each iteration, a field is placed at the starting position indicated by the initial starting position plus zero or more multiples of the offsets, and then the semiconductor wafer is tiled over with fields. The dies that are completely covered by the wafer are counted, satisfying any added constraints. The starting position having the maximum number of dies is then used as the actual starting position.

Thus, first an iteration counter i is set to zero (308). The starting position is set to the x-coordinate of the initial starting position plus i times the delta-x offset, and the y-coordinate of the initial starting position plus i times the delta-y offset (310). The wafer is completely covered with fields (312), starting with a first field at the starting position just determined, and then tiling over the rest of the wafer with other fields, where the fields are placed edge-to-edge next to each other, without any spacing between adjacent fields, and without any overlap between adjacent fields. The dies completely covered by the wafer are counted, and the variable d(i) is set equal to this number (314). A die being completely covered by the wafer means that the die does not have any part that is not covered by the wafer.

Next, any constraints that have been set are satisfied (316). One constraint is that alignment marks on the wafer are taken into account, such that any dies overlapping a portion of an alignment mark are subtracted from the die count previously preformed. Another constraint is that a certain distance from the edge of the field must be within the semiconductor wafer, or the starting position for which dies are being counted is discounted, and automatically cannot be used as the actual starting position. A related constraint is that at least one die of this field must be completely covered by the semiconductor wafer, or the starting position for which dies are being counted is also discounted, and automatically not used as the actual starting position. Other constraints include a maximum number of dies that can be counted, and a minimum number of fields that must be on the semiconductor wafer, among other constraints.

Next, if the precision of the offset value is not yet equal to a predetermined value, such as 0.001 (318), then the counter is incremented by one (320), and 310, 312, 314, and 316 of the method 300 are again performed. Once the precision has reached 0.001, this means that iterations have been completed. Therefore, the actual starting position is set equal to the starting position for the iteration i yielding the maximum number of dies, d(i) (322), barring any constraints that do not permit this starting position from being used as the actual starting position. From the actual starting position, semiconductor device fabrication can then be accomplished. For instance, photolithographic job file creation may be performed, where such information can be subsequently inspected. A unified semiconductor wafer map, showing the dies and the fields on the semiconductor wafer, can also be generated and viewed by a user.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
    determining an x-coordinate of an initial starting position on a semiconductor wafer;
    determining a y-coordinate of the initial starting position on the semiconductor wafer;
    determining a delta-x offset and a delta-y offset for subsequent starting positions;
    starting at a current starting position equal to the initial starting position;
    repeating for each of a predetermined number of times;
        covering the semiconductor wafer with fields;
        counting a number of dies that are completely covered by the semiconductor wafer;
        increasing the current starting position by the delta-x offset and the delta-y offset; and
    setting as an actual starting position the current starting position at which the number of dies completely covered by the semiconductor wafer is maximized.

2. The method of claim 1, wherein determining the x-coordinate of the initial starting position comprises determining the x-coordinate of the initial starting position based on a size of a field.

3. The method of claim 2, wherein determining the x-coordinate of the initial starting position based on the size of the field comprises determining the x-coordinate of the initial starting position as two times the size of the field divided by three, plus one millimeter.

4. The method of claim 1, wherein determining the y-coordinate of the initial starting position comprises determining the y-coordinate of the initial starting position based on a notch reserve distance for the semiconductor wafer.

5. The method of claim 4, wherein determining the y-coordinate of the initial starting position based on the notch reserve distance for the semiconductor wafer comprises determining the y-coordinate of the initial starting position as the notch reserve distance.

6. The method of claim 1, wherein determining the delta-x offset and the delta-y offset comprises:
    starting at the initial starting position;
    covering the semiconductor wafer with fields; and
    determining the delta-x offset and the delta-y offset based on a center of the semiconductor wafer and one of the fields covering the semiconductor wafer.

7. The method of claim 6, wherein determining the delta-x offset and the delta-y offset based on the center of the semiconductor wafer and the one of the fields covering the semiconductor wafer comprises determining the delta-x offset and the delta-y offset as a distance between the center of the semiconductor wafer and the one of the fields covering the semiconductor wafer nearest the center of the semiconductor wafer.

8. The method of claim 1, further comprising, after counting the number of dies that are completely covered by the semiconductor wafer, satisfying one or more constraints.

9. The method of claim 8, wherein satisfying the one or more constraints comprises a center field of the fields covering the semiconductor wafer lying within semiconductor wafer.

10. The method of claim 9, wherein satisfying the one or more constraints further comprises at least one die within the center field being completed covered by the semiconductor wafer.

11. The method of claim 8, wherein satisfying the one or more constraints comprises subtracting from the number of dies one or more of the number of dies overlapping an alignment mark.

12. The method of claim 8, wherein satisfying the one or more constraints comprises satisfying a maximum number of dies constraint and a minimum number of fields constraint.

13. A semiconductor device fabricated at least in part by exposing a photolithographic image on a semiconductor wafer divided into a number of dies by performing a method comprising:

determining an x-coordinate of an initial starting position on a semiconductor wafer based on a size of a field;

determining a y-coordinate of the initial starting position on the semiconductor wafer based on a notch reserve distance for the semiconductor wafer;

determining a delta-x offset and a delta-y offset for subsequent starting positions;

starting at a current starting position equal to the initial starting position;

repeating for each of a predetermined number of times;
    covering the semiconductor wafer with fields;
    counting a number of dies that are completely covered by the semiconductor wafer;
    increasing the current starting position by the delta-x offset and the delta-y offset; and setting as an actual starting position the current starting position at which the number of dies completely covered by the wafer is maximized.

14. The device of claim 13, wherein determining the x-coordinate of the initial starting position comprises determining the x-coordinate of the initial starting position as two times the size of the field divided by three, plus one millimeter.

15. The device of claim 13, wherein determining the y-coordinate of the initial starting position comprises determining the y-coordinate of the initial starting position as the notch reserve distance.

16. The device of claim 13, wherein determining the delta-x offset and the delta-y offset comprises:
    starting at the initial starting position;
    covering the semiconductor wafer with fields; and
    determining the delta-x offset and the delta-y offset based on a center of the semiconductor wafer and one of the fields covering the semiconductor wafer.

17. The device of claim 16, wherein determining the delta-x offset and the delta-y offset based on the center of the semiconductor wafer and the one of the fields covering the semiconductor wafer comprises determining the delta-x offset and the delta-y offset as a distance between the center of the semiconductor wafer and the one of the fields covering the semiconductor wafer nearest the center of the semiconductor wafer.

18. A method comprising:

determining an x-coordinate of an initial starting position on a semiconductor wafer as two times a size of a field divided by three, plus one;

determining a y-coordinate of the initial starting position on the semiconductor wafer as a notch reserve distance;

determining a delta-x offset and a delta-y offset for subsequent starting positions;

starting at a current starting position equal to the initial starting position;

repeating for each of a predetermined number of times;
    covering the semiconductor wafer with fields;
    counting a number of dies that are completely covered by the semiconductor wafer;
    satisfying one or more constraints;
    increasing the current starting position by the delta-x offset and the delta-y offset; and setting as an actual starting position the current starting position at which the number of dies completely covered by the wafer is maximized.

19. The method of claim 18, wherein determining the delta-x offset and the delta-y offset comprises:
    starting at the initial starting position;
    covering the semiconductor wafer with fields; and
    determining the delta-x offset and the delta-y offset based on a center of the semiconductor wafer and one of the fields covering the semiconductor wafer.

20. The method of claim 19, wherein determining the delta-x offset and the delta-y offset based on the center of the semiconductor wafer and the one of the fields covering the semiconductor wafer comprises determining the delta-x offset and the delta-y offset as a distance between the center of the semiconductor wafer and the one of the fields covering the semiconductor wafer nearest the center of the semiconductor wafer.

* * * * *